United States Patent
Watkins et al.

[11] Patent Number: 5,822,226
[45] Date of Patent: Oct. 13, 1998

[54] HARDWARE SYSTEM VERIFICATION ENVIRONMENT TOOL

[75] Inventors: Daniel Watkins, Saratoga; Satish Venugopal, Santa Clara, both of Calif.

[73] Assignee: LSI Logic Corporation, Milpitas, Calif.

[21] Appl. No.: 626,773

[22] Filed: Apr. 2, 1996

[51] Int. Cl.[6] .................................................... G06F 13/00
[52] U.S. Cl. ......................... 364/578; 371/22.1; 395/500
[58] Field of Search ..................................... 364/578, 488, 364/489, 490, 491; 395/500; 371/22.1

[56] References Cited

U.S. PATENT DOCUMENTS

| | | | |
|---|---|---|---|
| 5,202,889 | 4/1993 | Aharon et al. | 371/27 |
| 5,438,673 | 8/1995 | Court et al. | 395/500 |
| 5,488,573 | 1/1996 | Brown et al. | 364/578 |
| 5,568,407 | 10/1996 | Hass et al. | 364/579 |

*Primary Examiner*—Kevin J. Teska
*Assistant Examiner*—A. S. Roberts
*Attorney, Agent, or Firm*—Oppenheimer Wolff & Donnelly LLP

[57] ABSTRACT

A random verification environment for verifying a semiconductor device includes a hardware engine programmed to include a random input generator that builds a set of test vectors. A first memory connected between the hardware engine and the semiconductor device stores the set of test vectors and supplies the set of vectors to the semiconductor device under the control of a first state machine generated by the hardware device. A second memory connected to the semiconductor device receives output signals from the semiconductor device in response to input test vectors. A random test iterator in the hardware engine provides a first state machine and also provides a second state machine that writes the signals output from the semiconductor device to the second memory. The test vectors are input to the semiconductor device at a rate equal to the operating rate of the semiconductor device. An expected output generator is arranged to receive the test vectors from the first memory. An output comparator is arranged to receive outputs from the expected output generator and from the second memory and to record whether the output of the semiconductor device for each test vector is the expected output provided by the expected output generator.

12 Claims, 1 Drawing Sheet

HARDWARE SYSTEM VERIFICATION ENVIRONMENT TOOL

BACKGROUND OF THE INVENTION

This invention relates generally to apparatus and methods for providing improved verification times for silicon core/chip designs.

Typically, simulation environments are used to exhaustively verify a core and/or chip design. To accelerate the verification process, faster workstations and faster simulators are constantly being desired. With the millions and even billions of simulation vectors needed to complete verification prior to building final silicon structures, verification approaches have not kept pace with the demand, especially given the dramatic increases in number of gates per core/chip.

In some cases hardware emulation of a core/chip design is used in a simulation environment. Hardware emulation is typically used in cases where the core/chip is represented in some silicon embodiment (different than the, final silicon structure) to run faster and is functioning in a target system similar to the final system into which the final silicon structure will be placed. Hardware emulation typically is an expensive approach that limits the verification to the limits of the target system, with limited corner cases being evaluated.

The prior methods for core/chip verification have significant disadvantages. One disadvantage is that simulation-based method does not keep pace with the demands for verifying new core/chip designs. In particular, simulation runs require excessive lengths of time and lead to low productivity. Hardware emulation can be very expensive and can be restrictive in terms of what is tested.

SUMMARY OF THE INVENTION

The present invention provides a methodology and tool set that dramatically accelerate verification of cores and chips.

The present invention further provides a methodology and tool set that accelerate simulation model verification.

The objectives and advantages of the present invention are achieved by providing simulation and hardware emulation with a target system as the current verification choices. The invention includes hardware emulation with a special target system designed to do comprehensive verification of the design.

A random verification environment device according to the invention for verifying a semiconductor device, comprises a hardware engine connected to the semiconductor device. The hardware engine is programmed to include a random input generator that builds a set of test vectors. A first memory connected between the hardware engine and the semiconductor device stores the set of test vectors and supplies the set of vectors to the semiconductor device under the control of a first state machine generated by the hardware device. A second memory connected to the semiconductor device receives output signals from the semiconductor device in response to input test vectors. A random test iterator in the hardware engine provides a first state machine and also provides a second state machine that writes the signals output from the semiconductor device to the second memory.

The first state machine preferably inputs the test vectors to the semiconductor device at a rate equal to the operating rate of the semiconductor device.

The random verification environment device according to the invention may also further include an expected output generator arranged to receive the test vectors from the first memory, and an output comparator arranged to receive outputs from the expected output generator and from the second memory and to record whether the output of the semiconductor device for each test vector is the expected output provided by the expected output generator.

The present invention further includes a method for verifying a semiconductor device with a random verification environment device. The method of the invention comprises the steps of connecting a hardware engine to the semiconductor device; programming the hardware engine to include a random input generator that builds a set of test vectors; connecting a first memory between the hardware engine and the semiconductor device for storing the set of test vectors and supplying the set of vectors to the semiconductor device; connecting a second memory to the semiconductor device to receive output signals therefrom in response to input test vectors; and providing a random test iterator in the hardware engine for producing a first state machine that controls the rate at which the vectors are inputs to the semiconductor device and a second state machine that writes the signals output from the semiconductor device to the second memory.

The present invention further includes a method for forming a random verification environment for verifying a semiconductor device that comprises the steps of connecting a hardware engine to the semiconductor device; programming the hardware engine to include a random input generator that builds a set of test vectors; connecting a first memory between the hardware engine and the semiconductor device for storing the set of test vectors and supplying the set of vectors to the semiconductor device; connecting a second memory to the semiconductor device to receive output signals therefrom in response to input test vectors; and providing a random test iterator in the hardware engine for producing a first state machine that controls the rate at which the vectors are inputs to the semiconductor device and a second state machine that writes the signals output from the semiconductor device to the second memory.

The method according to the invention for forming a random verification environment for verifying a semiconductor may further include the step of arranging the first state machine to input the test vectors to the semiconductor device at a rate equal to the operating rate of the semiconductor device. The method may also further including the steps of arranging an expected output generator to receive the test vectors from the first memory, and arranging an output comparator to receive outputs from the expected output generator and from the second memory and to record whether the output of the semiconductor device for each test vector is the expected output provided by the expected output generator.

The method for forming a random verification environment for verifying a semiconductor preferably still further includes the steps of writing the random input generator, the expected output generator, the output comparator and the random test iterator in a Verilog program, and compiling the Verilog program into a portable C computer language.

Additional objects and advantages of the present invention are described in the following detailed description of a preferred embodiment of the invention, taken in conjunction with the drawings, which are briefly described below.

DETAILED DESCRIPTION OF THE INVENTION

Figure 1:
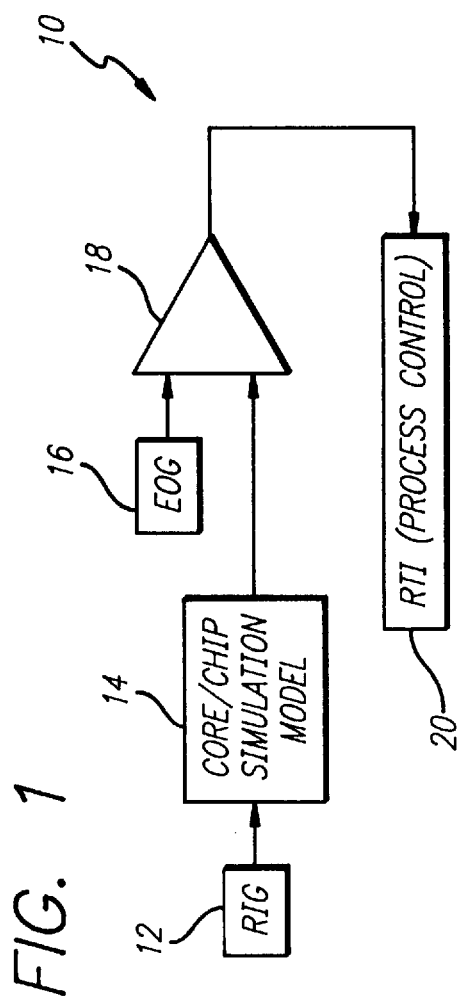
FIG. 1 is a block diagram illustrating a simulation based system verification environment according to the invention.
Figure 2:
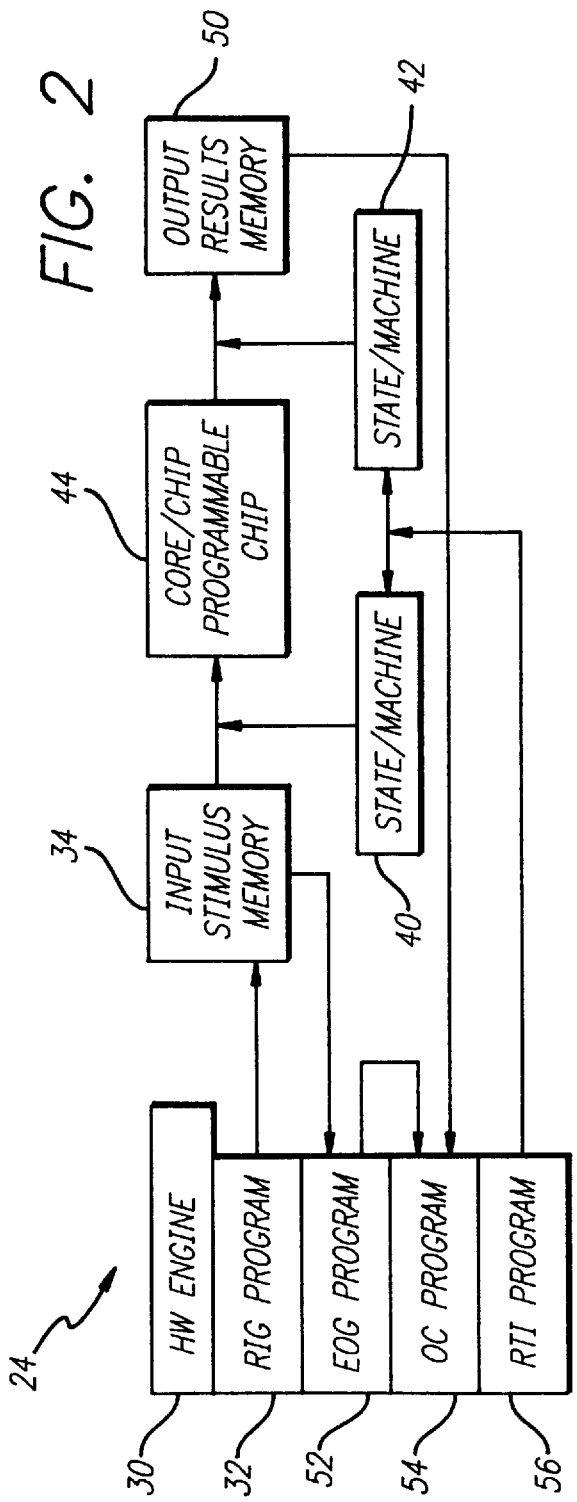
FIG. 2 is a block diagram of a hardware-based simulation verification environment.

Referring to FIGS. 1 and 2, the present invention provides hardware emulation with a special target system designed to do comprehensive verification of a core/chip design selected for verification and testing. The vehicle to demonstrate the utility of such an approach is the hardware random verification environment.

A simulator-based Random Verification Environment (RVE) can provide billions of sets of random inputs to the design, run simulation, and monitor the outputs. If the outputs do not match the expected outputs, then a defect or "bug" possibly exists in the device being tested.

Referring to FIG. 1, an RVE 10 has four parts. The first part is a random input generator 12. When what is selected for verification and testing is a microprocessor (not shown), the random input generator 12 is a random code generator (not shown). Random code generators suitable for practicing the present invention with a microprocessor are known in the art. Signals output from the random input generator 12 are input to a core/chip simulation model 14.

For a system interface, the random input generator 12 is typically a random bus protocol generator (not shown). Ideally, the random input generator 12 can be parameterized to control the mix of input vectors and to restrict 'illegal' inputs. The second part of the RVE is an expected output generator (EOG) 16. The EOG 16 may be implemented in a number of embodiments. As illustrative examples using current technology, the EOG 16 can be core/chip simulation model results, a very high level behavior model or a known good model or silicon. As technology advances, it is likely that other techniques for implementing the EOG 16.

Signals output from the core/chip simulation model 14 and the expected output generator 16 are input to an output comparator 18. The output comparator 18 compares the output of the actual core/chip design 14 with the output of the expected output generator 16. The last component of the RVE 10 is a random test iterator (RTI) 20. The random test iterator 20 is typically a script that runs random tests one after another and saves the results of any test run that gives results indicative of defects or bugs in the device being tested. The random test iterator 20 can be run continuously and record the pass/fail status of each test.

Referring to FIG. 2, a hardware based RVE 24 can provide all the capability of the software based RVE 10. The hardware-based RVE 24 has the advantage of operating at hardware emulation speeds, which exceed the speeds of software emulation. A hardware engine 30 runs a random input generator 32 and builds a batch set of vectors that are stored in memory 34.

The hardware engine 30 also sets up state machines 40 and 42 that run at the speed of a core/chip silicon device 44 being tested. This silicon device being tested can be a part of a final device (not shown) so that fabrication times are not holding up verification. The state machine 40 is started and used to apply the vectors from memory 34 to the silicon device 44 being tested. The state machine 40 applies the vectors at the operating speed of the core/chip silicon device 44. The state machine 42 writes the outputs of the core/chip silicon device 44 to a memory 50.

The hardware engine 30 then runs an EOG 52 with an output comparator 54 and an RTI 56. The EOG 52 and the output comparator 54 record the pass/fail status of the device 44 for each vector.

The hardware-based RVE 24 according to the invention may be implemented by having the parts to be run in hardware written in a portable C. C is a popular computer language that makes it easy to get programs to run on a hardware engine. Verilog is a high level language popular in computer design. VCS is a popular simulator for Verilog that compiles the Verilog to C. Therefore, writing the RVE components in Verilog and compiling them to portable C using VCS or VCS-like tools, permits the RVE components to be easily be run on the hardware engine 30. Building and verifying the RVE can first occur in the Verilog simulator environment. With the steps described above, the RVE can then be migrated to the hardware engine 30 in a straightforward fashion.

The hardware based RVE 24 according to the invention has the advantage of dramatically improving verification time of core/chip designs. With the productivity/time improvement provided by the present invention, the time required for simulation based verification can also be reduced. For large designs having millions or billions of vectors to run against them, the present invention can reduce the weeks or months of simulation time presently required to hours or days. Running a billion vectors on a million gate device can require weeks of time with software emulation. With hardware of the present invention it can take less than a day to run a test with a billion vectors. The time required to produce a product that can be marketed is dramatically improved.

Some components of the RVE 24 can be in the hardware engine 30 while the remainder can be in the simulation environment. Achieving generation of random patterns and applying them to get results from the semiconductor device being tested is a significant step forward in the testing of semiconductor devices. The resulting outputs may have to be uploaded to the simulation environment and compared to the expected outputs after having the expected output simulations run. Building complex, interactive, simulation environments in hardware will not save much in overall verification time because the time to run the environment on a hardware engine would not be batched based and run at the speed of the silicon.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

We claim:

1. A random verification environment device for verifying a semiconductor device, comprising:

a hardware engine connected to the semiconductor device, the hardware engine being programmed to include a random input generator that builds a set of test vectors;

a first memory connected between the hardware engine and the semiconductor device for storing the set of test vectors and supplying the set of vectors to the semiconductor device;

a second memory connected to the semiconductor device to receive output signals therefrom in response to input test vectors; and a random test iterator in the hardware engine arranged to produce a first state machine that controls the rate at which the vectors are inputs to the semiconductor device and a second state machine that writes the signals output from the semiconductor device to the second memory wherein the first state machine inputs the test vectors to the semiconductor device at a rate equal to the operating rate of the semiconductor device.

2. The random verification environment device of claim 1 further including:

an expected output generator arranged to receive the test vectors from the first memory; and an output comparator arranged to receive outputs from the expected output generator and from the second memory and to record whether the output of the semiconductor device for each test vector is the expected output provided by the expected output generator.

3. A method for verifying a semiconductor device with a random verification environment device, comprising the steps of:

connecting a hardware engine to the semiconductor device;

programming the hardware engine to include a random input generator that builds a set of test vectors;

connecting a first memory between the hardware engine and the semiconductor device for storing the set of test vectors and supplying the set of vectors to the semiconductor device;

connecting a second memory to the semiconductor device to receive output signals therefrom in response to input test vectors; and providing a random test iterator in the hardware engine for producing a first state machine that controls the rate at which the vectors are inputs to the semiconductor device and a second state machine that writes the signals output from the semiconductor device to the second memory and arranging the first state machine to input the test vectors to the semiconductor device at a rate equal to the operating rate of the semiconductor device.

4. The method of claim 3, further including the steps of:

arranging an expected output generator to receive the test vectors from the first memory; and arranging an output comparator to receive outputs from the expected output generator and from the second memory and to record whether the output of the semiconductor device for each test vector is the expected output provided by the expected output generator.

5. A method for forming a random verification environment for verifying a semiconductor device, comprising the steps of:

connecting a hardware engine to the semiconductor device;

programming the hardware engine to include a random input generator that builds a set of test vectors;

connecting a first memory between the hardware engine and the semiconductor device for storing the set of test vectors and supplying the set of vectors to the semiconductor device;

connecting a second memory to the semiconductor device to receive output signals therefrom in response to input test vectors; and providing a random test iterator in the hardware engine for producing a first state machine that controls the rate at which the vectors are inputs to the semiconductor device and a second state machine that writes the signals output from the semiconductor device to the second memory and arranging the first state machine to input the test vectors to the semiconductor device at a rate equal to the operating rate of the semiconductor device.

6. The method of claim 5, further including the steps of:

arranging an expected output generator to receive the test vectors from the first memory; and arranging an output comparator to receive outputs from the expected output generator and from the second memory and to record whether the output of the semiconductor device for each test vector is the expected output provided by the expected output generator.

7. The method of claim 6, further including the steps of:

writing the random input generator as a program in a high level program language; and compiling the program into a computer language.

8. The method of claim 6, further including the steps of:

writing the expected output generator as a program in a high level program language; and compiling the program into a computer language.

9. The method of claim 6, further including the steps of:

writing the output comparator as a program in a high level program language; and compiling the program into a computer language.

10. The method of claim 6, further including the steps of:

writing the random test iterator as a program in a high level program language; and compiling the program into a computer language.

11. The method of claim 7, 8, 9 or 10, further comprising the step of selecting Verilog as the high level program language.

12. The method of claim 11, further comprising the step of selecting portable C as the computer language.

* * * * *